(12) United States Patent  
Kabutoya

(10) Patent No.: US 12,463,098 B2  
(45) Date of Patent: Nov. 4, 2025

(54) SEMICONDUCTOR DEVICE AND PRODUCTION METHOD FOR SEMICONDUCTOR DEVICE

(71) Applicant: KYOCERA Corporation, Kyoto (JP)

(72) Inventor: Shingo Kabutoya, Tsukuba (JP)

(73) Assignee: KYOCERA Corporation, Kyoto (JP)

( * ) Notice: Subject to any disclaimer, the term of this patent is extended or adjusted under 35 U.S.C. 154(b) by 744 days.

(21) Appl. No.: 17/434,034

(22) PCT Filed: Feb. 28, 2020

(86) PCT No.: PCT/JP2020/008452  
§ 371 (c)(1),  
(2) Date: Aug. 26, 2021

(87) PCT Pub. No.: WO2020/179702  
PCT Pub. Date: Sep. 10, 2020

(65) Prior Publication Data  
US 2022/0139780 A1 May 5, 2022

(30) Foreign Application Priority Data  
Mar. 1, 2019 (JP) .................................. 2019-037198

(51) Int. Cl.  
H01L 21/78 (2006.01)  
H01L 23/00 (2006.01)

(52) U.S. Cl.  
CPC ............ H01L 21/78 (2013.01); H01L 23/564 (2013.01)

(58) Field of Classification Search  
CPC .................. H01L 21/78; H01L 23/564; H01L 2223/5446; H01L 23/544; H01L 2223/54426; H01L 21/768; H01L 23/522; H01L 22/32; H01L 21/67288; H01L 21/76877  
See application file for complete search history.

(56) References Cited

U.S. PATENT DOCUMENTS

2016/0240641 A1* 8/2016 Okawara ............. H01L 29/7397  
2018/0374741 A1 12/2018 Tutuc et al.  
2019/0074386 A1* 3/2019 Ebihara ............... H01L 29/1608  
2019/0348510 A1* 11/2019 Yilmaz ............... H01L 29/1095

FOREIGN PATENT DOCUMENTS

| JP | 2001-129822 A | 5/2001 |
| JP | 2012-009473 A | 1/2012 |
| JP | 2014-082514 A | 5/2014 |
| JP | 2016-115803 A | 6/2016 |
| JP | 2018-078145 A | 5/2018 |

* cited by examiner

Primary Examiner — Thanh T Nguyen  
(74) Attorney, Agent, or Firm — Volpe Koenig

(57) ABSTRACT

The following are performed in this method for producing a semiconductor device: a step for forming multiple surface electrode metals joined to a surface of a semiconductor layer on a wafer on which multiple semiconductor devices are attached; a step for excavating a semiconductor layer outside an outer edge of the surface electrode metal to form an outermost edge trench of the semiconductor device; a dicing step for cutting out individual semiconductor devices from the wafer; and a kerf check performed after the dicing step by checking the distance from the outermost edge trench to the chip outline position of the semiconductor device.

10 Claims, 1 Drawing Sheet

SEMICONDUCTOR DEVICE AND PRODUCTION METHOD FOR SEMICONDUCTOR DEVICE

CROSS REFERENCE TO RELATED APPLICATIONS

This application is the U.S. National Stage, under 35 U.S.C. § 371, of International Application No. PCT/JP2020/008452, filed Feb. 28, 2020, which claims the benefit of Japanese Patent Application No.: 2019-037198, filed Mar. 1, 2019, the contents of which are hereby incorporated by reference herein.

FIELD OF INVENTION

The present disclosure relates to a semiconductor device and a production method for the semiconductor device.

TECHNICAL BACKGROUND

Generally, a dicing device for cutting out a semiconductor device from a wafer and a kerf check method are known.

The dicing device is a device that obtains chips (individual semiconductor devices) from a wafer. As described in JP 2001-129822A, etc., a blade cuts a wafer along a street into a dice shape. Abrasive grains are bonded to an outer periphery of the blade. According to the dicing device, blade wear causes chipping on the street of the wafer. Thermal deformation of the blade shifts a position of a groove (kerf) cut by the blade from the center of the street. Therefore, the dicing device checks the kerf of the blade at preset times. Specifically, the groove cut by the blade is illuminated with light. The groove is imaged by a camera. Image processing is performed on the image signal, or the image is visually inspected. Thus position and width of the groove, presence or absence of chipping, and the like are checked.

Conventionally, in a kerf check, it has been checked how far an edge (chip contour position) of a cutting processing region by a blade or the like on a wafer is from a step of an outer peripheral oxide film as a reference. The outer peripheral oxide film is provided on an outer periphery on a surface of each chip region. A rising step closest to the edge (chip contour position) of the cutting processing region is sometimes used as a reference for the kerf check.

SUMMARY OF INVENTION

Solution to Problem

According to an aspect of the present disclosure, a production method for a semiconductor device includes:
  forming multiple surface electrode metals joined to a surface of a semiconductor layer on a wafer on which multiple semiconductor devices are attached;
  forming an outermost trench of the semiconductor device by digging the semiconductor layer outside an outer edge of the surface electrode metal;
  dicing of cutting out individual semiconductor devices from the wafer; and
  checking a kerf by checking a distance between the outermost trench and a chip contour position of the semiconductor device after the dicing.

According to an aspect of the present disclosure, a semiconductor device includes:
  a semiconductor substrate;
  a semiconductor layer which is layered on a surface of the semiconductor substrate;
  a surface electrode metal joined to a surface of the semiconductor layer;
  a trench dug in the surface of the semiconductor layer under the surface electrode metal; and
  an outermost trench dug in the surface of the semiconductor layer outside an outer edge of the surface electrode metal.

DETAILED DESCRIPTION

An embodiment of the present disclosure will be described below with reference to drawings.

Figure 1:
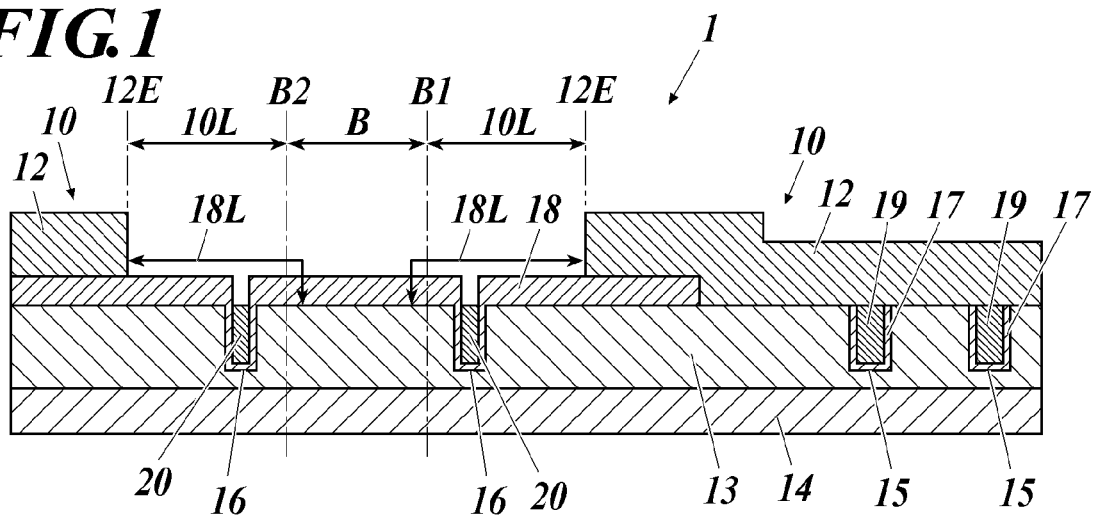
FIG. 1 is a cross-sectional view of a wafer according to an embodiment, showing a portion where two semiconductor devices are adjacent to each other.

As shown in FIG. 1, a semiconductor device 10 of the embodiment is a Schottky barrier diode that includes a semiconductor substrate 14, a semiconductor layer 13, a trench 15, an outermost trench 16, insulating films 17, 18, polysilicon 19, 20, and a surface electrode metal 12.

The semiconductor substrate 14 is an N-type high-concentration silicon substrate. The semiconductor layer 13 is an N-type low-concentration semiconductor layer which is layered on a surface of the semiconductor substrate 14 in the epitaxial growth method.

The trench 15 and the outermost trench 16 are dug on a surface of the semiconductor layer 13.

The insulating films 17, 18 are made of silicon oxide films. The insulating film 17 covers the entire inner surface of the trench 15. The insulating film 18 covers an outer peripheral surface of the semiconductor layer 13 including the entire inner surface of the outermost trench 16.

The insides of the trench 15 and the outermost trench 16 coated with the insulating films 17, 18 are filled with polysilicon 19, 20. The polysilicon 19, 20 can be replaced with different conductors. For example, various metals may be used instead of the polysilicon 19, 20. In the following description, the polysilicon 19, 20 is described as an example.

The surface electrode metal 12 covers:
  the polysilicon 19 embedded in the trench 15; and
  a surface of a central portion of the semiconductor layer 13 which is exposed from the insulating film 18.

The surface electrode metal 12 forms a Schottky barrier together with the surface of the central portion of the semiconductor layer.

An outer periphery of the surface electrode metal 12 extends on the insulating film 18. An outer edge 12E of the surface electrode metal 12 is located at a position separated inward from the outermost trench 16.

The trench 15 is dug on the surface of the semiconductor layer 13 under the surface electrode metal 12. The polysilicon 19 embedded therein is connected to the surface electrode metal 12 and functions as an internal electrode embedded in the semiconductor layer 13.

The outermost trench 16 is dug on the surface of the semiconductor layer 13 outside the outer edge 12E of the surface electrode metal 12. The outermost trench 16 is used as a reference for the kerf check. A portion from an outer side of the outermost trench 16 to a chip contour position B1 (B2) has a flat surface so that no structure can be used as a reference for the kerf check. A distance between the outermost trench 16 and the chip contour position B1 (B2) according to design is constant.

A portion of the surface of the semiconductor layer 13 outside the outer edge 12E of the surface electrode metal 12 is coated with the insulating film 18, the portion including the chip contour position B1 (B2) as well as the inner surface of the outermost trench 16. As a result, insulation around the chip is ensured, and the chip can be miniaturized.

Figure 2:
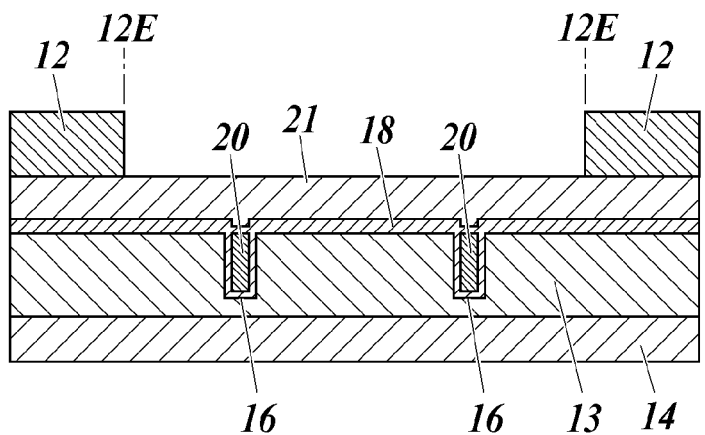
FIG. 2 is a cross-sectional view of a wafer according to another embodiment, showing a portion where two semiconductor devices are adjacent to each other.

As shown in FIG. 2, an upper surface of the polysilicon 20 embedded in the outermost trench may also be coated with the insulating film 18. However, a step must not disappear.

As shown in FIG. 2, a transparent insulating film 21 that covers the outermost trench 16 may be provided. It further secures insulation around the chip. It allows for further chip miniaturization. The transparent insulating film 21 is, for example, an NSG (none-topped silicate glass) film, a PSG (phospho silicate glass) film, a BPSG (boro-phospho silicate glass) film, or a TEOS (tetra ethoxy silane) film. The transparent insulating film 21 may be made of other material that transmits at least a part of visible light. The transparent insulating film 21 may be made of transparent material, such as glass, or translucent material.

Sometimes the surface electrode metal 12 is an anode while an opposite-side electrode metal (not shown) is a cathode. The opposite-side electrode metal is formed so as to cover an opposite side of the semiconductor substrate 14.

To form a MOSFET (methal oxide semiconductor field effect transistor), a P body, a gate, and the like are formed at the center. The surface electrode metal 12 is a source electrode while the opposite-side electrode metal film is a drain electrode. To form an IGBT (insulated gate bipolar transistor), a P-type high-concentration substrate is further applied as the semiconductor substrate 14. The surface electrode metal 12 is an emitter electrode while the opposite-side electrode metal film is a collector electrode.

A depth of the trench 15 and a depth of the outermost trench 16 are substantially the same. A width of the trench 15 and a width of the outermost trench 16 may also be substantially the same.

A difference between the depth of the trench 15 and the depth of the outermost trench 16 may be less than 10% of the depth of the outermost trench 16. A difference between the width of the trench 15 and the width of the outermost trench 16 may be less than 10% of the width of the outermost trench 16.

To manufacture the semiconductor device 10, in a wafer 1 on which a large number of semiconductor devices 10 are attached, the surface of the semiconductor layer 13 is covered with a mask. The mask opens at portions where the trench 15 and the outermost trench 16 are to be formed. The trench 15 and the outermost trench 16 are dug by etching. Thus, a step of forming the trench 15 by digging the semiconductor layer 13 and a step of forming the outermost trench 16 by digging the semiconductor layer 13 are carried out in one step. As a result, the depth of the trench 15 and the depth of the outermost trench 16 are substantially the same.

Then, the entire surface of the semiconductor layer 13 on which the trench 15 and the outermost trench 16 are formed is thermally oxidized. An oxide film is removed at unnecessary portions. Thus, the insulating films 17, 18 are formed.

Then, a step of embedding the polysilicon 19 in the trench 15 and a step of embedding the polysilicon 20 in the outermost trench 16 are carried out in one step.

As described above, an additional step for providing the outermost trench 16 is unnecessary. Efficiency of manufacture is improved.

Then, in a dicing step of cutting out the individual semiconductor devices 10 from the wafer 1, a distance between the outermost trench 16 and the chip contour position B1 (B2) is checked. Thus, the kerf check is carried out.

Dicing is performed by inserting a cutting blade into a cutting processing area B, etc. It is checked whether a distance between an edge of the processed portion and the outermost trench 16 is within an allowable range.

Figure 3:
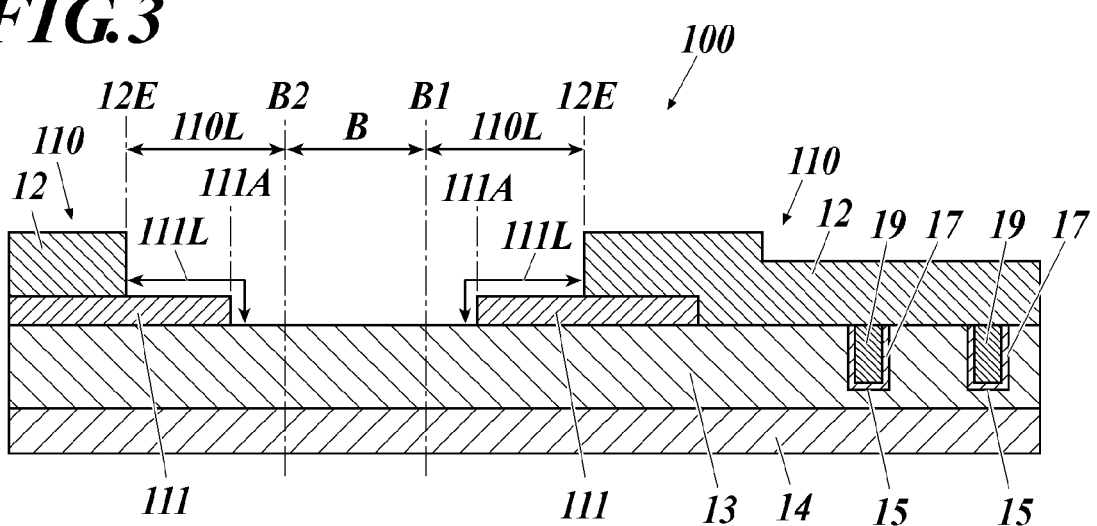
FIG. 3 is a cross-sectional view of a wafer according to an example for comparison, showing a portion where two semiconductor devices are adjacent to each other.

In a semiconductor device 110 of an example for comparison in FIG. 3, the same reference numerals are given to portions corresponding to those of the semiconductor device 10 of the embodiment.

An insulation creepage distance 111L of the semiconductor device 110 needs to be long to some extent. The insulation creepage distance 111L is separated inward from the chip contour position B1 (B2). Therefore, a size 110L of an edge portion is longer. The semiconductor device 110 becomes larger by that amount.

On the other hand, according to the semiconductor device 10 of the embodiment, an insulation creepage distance 18L extends below the insulating film at the chip contour position B1 (B2). A size 10L of the edge portion can be shortened while insulation around the chip is secured. The semiconductor device 10 can be made smaller by that amount.

If an outer peripheral oxide film 111 of the semiconductor device 110 extends to the cutting processing region B, a step 111A used as a reference for the kerf check disappears.

However, according to the semiconductor device 10 of the embodiment, although the outer peripheral oxide film 18 extends to the cutting processing region B, the outermost trench 16 can be used as a reference for the kerf check.

The outer peripheral oxide films 18, 111 are formed all around an edge of the surface electrode metal 12. The outermost trench 16 in the semiconductor device 10 of the embodiment may also be formed all around the edge so as to form a ring. In this case, a reference for the kerf check can be obtained at any position on the outer periphery of the chip.

Embodiments of the present disclosure are described above. Embodiments are shown as examples, and various modifications are possible. The components can be omitted, replaced or changed within the scope of the claims of the disclosure.

INDUSTRIAL APPLICABILITY

The present disclosure can be used in a semiconductor device and a production method for the semiconductor device.

REFERENCE SIGNS LIST

1 wafer
10 semiconductor device
12 surface electrode metal
13 semiconductor layer
14 semiconductor substrate
15 trench 16 outermost trench
17, 18 insulating film
19, 20 polysilicon
21 transparent insulating film
B cutting processing area
B1, B2 edge (chip contour position)

The invention claimed is:

1. A production method for a semiconductor device, comprising:
   forming a surface electrode metal joined to portions of a surface of a semiconductor layer on a wafer on which multiple semiconductor devices are attached;
   forming an outermost trench of the semiconductor device by digging the semiconductor layer outside an outer edge of the surface electrode metal,
      wherein the outer edge of the surface electrode metal is located at a position separated inward from the outermost trench, such that the outermost trench is not covered by the surface electrode metal;
   forming a trench in a surface of the semiconductor layer under the surface electrode metal;
   embedding a polysilicon in the trench,
      wherein the surface electrode metal are directly connected to the polysilicon;
   oxidizing the surface of the semiconductor layer on which the trench and outmost trench are formed to form an insulating film in the trench to cover an entire inner surface of the trench,
      wherein the surface electrode metal covers an entire peripheral surface of each of the trench, the polysilicon, and the insulating film;
   dicing of cutting out individual semiconductor devices from the wafer; and
   checking a kerf by checking a distance between the outermost trench and a chip contour position of the semiconductor device after the dicing.

2. The production method for the semiconductor device according to claim 1, wherein forming the outermost trench and the trench by digging the semiconductor layer are carried out in one step.

3. The production method for the semiconductor device according to claim 1, wherein embedding a conductor in the outermost trench and embedding a conductor in the trench are carried out in one step.

4. A semiconductor device, comprising:
   a semiconductor substrate;
   a semiconductor layer which is layered on a surface of the semiconductor substrate;
   a surface electrode metal joined to portions of a surface of the semiconductor layer;
   a trench dug in the surface of the semiconductor layer under the surface electrode metal;
   an insulating film in the trench, and the insulating film covers an entire inner surface of the trench; and
   an outermost trench dug in the surface of the semiconductor layer outside an outer edge of the surface electrode metal,
   wherein the outer edge of the surface electrode metal is located at a position separated inward from the outermost trench, such that the outermost trench is not covered by the surface electrode metal,
   wherein a polysilicon is embedded in the trench,
   wherein the surface electrode metal covers an entire peripheral surface of each of the trench, the polysilicon, and the insulating film, and
   wherein the surface electrode metal is directly connected to the polysilicon.

5. The semiconductor device according to claim 4, wherein a portion of the surface of the semiconductor layer outside the outer edge of the surface electrode metal is coated with a second insulating film, the portion including a chip contour position as well as an inner surface of the outermost trench.

6. The semiconductor device according to claim 4, wherein a difference between a depth of the trench and a depth of the outermost trench is less than 10% of the depth of the outermost trench.

7. The semiconductor device according to claim 4, wherein a difference between a width of the trench and a width of the outermost trench is less than 10% of the width of the outermost trench.

8. The semiconductor device according to claim 4, further comprising:
   a second insulating film which covers the outermost trench and which transmits light.

9. The semiconductor device according to claim 4, wherein a portion from an outer side of the outermost trench to the chip contour position has a flat surface.

10. The semiconductor device according to claim 4, wherein in a cross-sectional view:
    the surface electrode metal includes a first portion and a second portion,
    the first portion the extends from a first end of the semiconductor layer to a first location,
    the second portion extends from the position separated inward from the outermost trench to a second end of the semiconductor layer, the second end is opposite to the first end,
    the outermost trench is between the first location and the position separated inward from the outermost trench, and
    the trench is located between a second location and the second end, the second location is a location closer to a central portion of the semiconductor layer than the position separated inward from the outermost trench.

* * * * *